(12) United States Patent
Hively

(10) Patent No.: US 9,306,527 B1
(45) Date of Patent: Apr. 5, 2016

(54) SYSTEMS, APPARATUSES, AND METHODS FOR GENERATING AND/OR UTILIZING SCALAR-LONGITUDINAL WAVES

(71) Applicant: GRADIENT DYNAMICS LLC, McLean, VA (US)

(72) Inventor: Lee M. Hively, Philadelphia, TN (US)

(73) Assignee: GRADIENT DYNAMICS LLC, McLean, VA (US)

( * ) Notice: Subject to any disclaimer, the term of this patent is extended or adjusted under 35 U.S.C. 154(b) by 0 days.

(21) Appl. No.: 14/726,305

(22) Filed: May 29, 2015

(51) Int. Cl.
- *H03H 2/00* (2006.01)
- *H01Q 1/36* (2006.01)
- *H04B 13/02* (2006.01)

(52) U.S. Cl.
CPC ............... *H03H 2/005* (2013.01); *H01Q 1/362* (2013.01); *H04B 13/02* (2013.01)

(58) Field of Classification Search
CPC .............. H01Q 9/16; H01Q 1/36; H01Q 9/04
USPC .......................................... 343/791, 792, 895
See application file for complete search history.

(56) References Cited

U.S. PATENT DOCUMENTS

| | | | |
|---|---|---|---|
| 512,340 A | 1/1894 | Tesla | |
| 1,220,005 A | 3/1917 | Rogers et al. | |
| 1,303,729 A | 5/1919 | Rogers | |
| 1,303,730 A | 5/1919 | Rogers | |
| 1,315,862 A | 9/1919 | Rogers | |
| 1,316,188 A | 9/1919 | Rogers | |
| 1,322,622 A | 11/1919 | Rogers et al. | |
| 1,349,103 A | 8/1920 | Rogers | |
| 1,349,104 A | 8/1920 | Rogers | |
| 4,429,280 A | 1/1984 | Gelinas | |
| 4,429,288 A | 1/1984 | Gelinas | |
| 4,432,098 A | 2/1984 | Gelinas | |
| 4,447,779 A | 5/1984 | Gelinas | |
| 4,491,795 A | 1/1985 | Gelinas | |
| 4,605,897 A | 8/1986 | Gelinas | |
| 5,248,988 A * | 9/1993 | Makino | H01Q 5/40 343/715 |
| 5,387,919 A * | 2/1995 | Lam | H01Q 9/18 343/795 |
| 5,440,317 A * | 8/1995 | Jalloul | H01Q 1/084 343/702 |
| 5,604,506 A * | 2/1997 | Rodal | H01Q 9/40 343/790 |
| 5,845,220 A | 12/1998 | Puthoff | |
| 6,104,107 A | 8/2000 | Avramenko et al. | |
| 7,981,841 B2 * | 7/2011 | Kramer | H01L 39/16 336/DIG. 1 |
| 2015/0065350 A1 * | 3/2015 | Hobl | H01F 6/06 505/211 |

* cited by examiner

*Primary Examiner* — Hoang V Nguyen
(74) *Attorney, Agent, or Firm* — Pillsbury Winthrop Shaw Pittman LLP

(57) ABSTRACT

Scalar-longitudinal waves (SLWs) may be transmitted and/or received. A first apparatus configured to transmit and/or receive SLWs may include a linear first conductor configured to operate as a linear monopole antenna at a first operating frequency. The first apparatus may include a tubular second conductor coaxially aligned with the first conductor and an annular balun configured to cancel most or all return current on an outer surface of the second conductor during operation such that the first conductor transmits or receives SLWs. A second apparatus configured to transmit and/or receive scalar-longitudinal waves may include a bifilar coil formed in an alternating fashion of a first conductor and a second conductor such that an electrical current in the coil will propagate in opposite directions in adjacent turns of the coil thereby cancelling any magnetic field so that during operation the coil transmits or receives SLWs.

28 Claims, 9 Drawing Sheets

US 9,306,527 B1

SYSTEMS, APPARATUSES, AND METHODS FOR GENERATING AND/OR UTILIZING SCALAR-LONGITUDINAL WAVES

FIELD OF THE DISCLOSURE

This disclosure relates to systems, apparatuses, and methods for generating and/or utilizing scalar-longitudinal waves.

BACKGROUND

Classical electrodynamic theory may be regarded as central to physics. An electric field (E) arises from an electric charge density ($\rho$). Charge motion creates an electrical current density (J) that drives dynamical changes in E and the magnetic field, B. The classical electrodynamic model is based on a coupled set of partial-differential equations for the quantities (B, E, J, $\rho$).

Classical electromagnetics predicts no wave creation by radial motion of a charged sphere. More specifically, spherical symmetry of the radial electric field on a charged, oscillating sphere implies a curl-free electric field ($\nabla \times E=0$), which in turn yields no variation in magnetic field from Faraday's law ($\nabla \times E = -\partial B/\partial t = 0$), corresponding to no magnetic wave. Thus, the Poynting vector, $E \times B/\mu$, is zero, resulting in no classical electromagnetic radiation. This statement applies more generally to no creation of electrical waves by radial motion of any extended charge distribution. An electrically equivalent antenna may include a classical linear monopole that is driven by a sinusoidal current to put charge onto and remove charge from the linear conductor (antenna).

SUMMARY

Exemplary implementations of the disclosure provide and/or facilitate transmission and/or reception of scalar-longitudinal waves (SLW), together with technology and/or applications using those waves. More specifically, this disclosure includes inter alia: (1) a more complete electrodynamics (MCE) model that may remove and/or lessen incompleteness and/or inconsistency in classical electrodynamics; (2) verification of a scalar-longitudinal wave (SLW) that arises from a gradient-driven current density; (3) SLW antenna apparatus designs; (4) experimental data demonstrating that the SLW exists and can be transmitted and received by SLW antenna apparatuses; (5) experimental data showing the SLW is not subject to the classical skin effect, as predicted by the MCE theory; (6) technology applications of the scalar-longitudinal waves; and (7) additional applications that arise from MCE.

One aspect of the disclosure relates to an apparatus configured to transmit or receive scalar-longitudinal waves. The apparatus may include a linear first conductor configured to operate as a linear monopole antenna at a first operating frequency. The apparatus may include a tubular second conductor coaxially aligned with the first conductor such that the first conductor extends out in a first direction from within the second conductor. The apparatus may include an annular skirt balun disposed at an end of the second conductor from which the first conductor extends. The balun may have a larger diameter than the second conductor. The balun may extend in a second direction opposite the first direction. The balun may be configured to cancel most or all return current on an outer surface of the second conductor during operation such that the first conductor transmits or receives scalar-longitudinal waves.

Another aspect of the disclosure relates to an apparatus configured to transmit or receive scalar-longitudinal waves. The apparatus may include a bifilar coil formed in an alternating fashion of a first conductor and a second conductor such that a given turn of the coil that is made of the first conductor is adjacent on either side to turns of the coil made of the second conductor. The first conductor and the second conductor may be conductively coupled such that an electrical current in the coil will propagate in opposite directions in adjacent turns of the coil thereby cancelling any magnetic field so that during operation the coil transmits or receives scalar-longitudinal waves.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. Also, it is to be expressly understood that permissive language (e.g., "may") used in the specification to describe the present technology conveys a present understanding of the underlying science, but any inadequacies in that understanding should not be used to limit the claims. As used in the specification and in the claims, the singular form of "a", "an", and "the" include plural referents unless the context clearly dictates otherwise.

DETAILED DESCRIPTION

Figure 1:
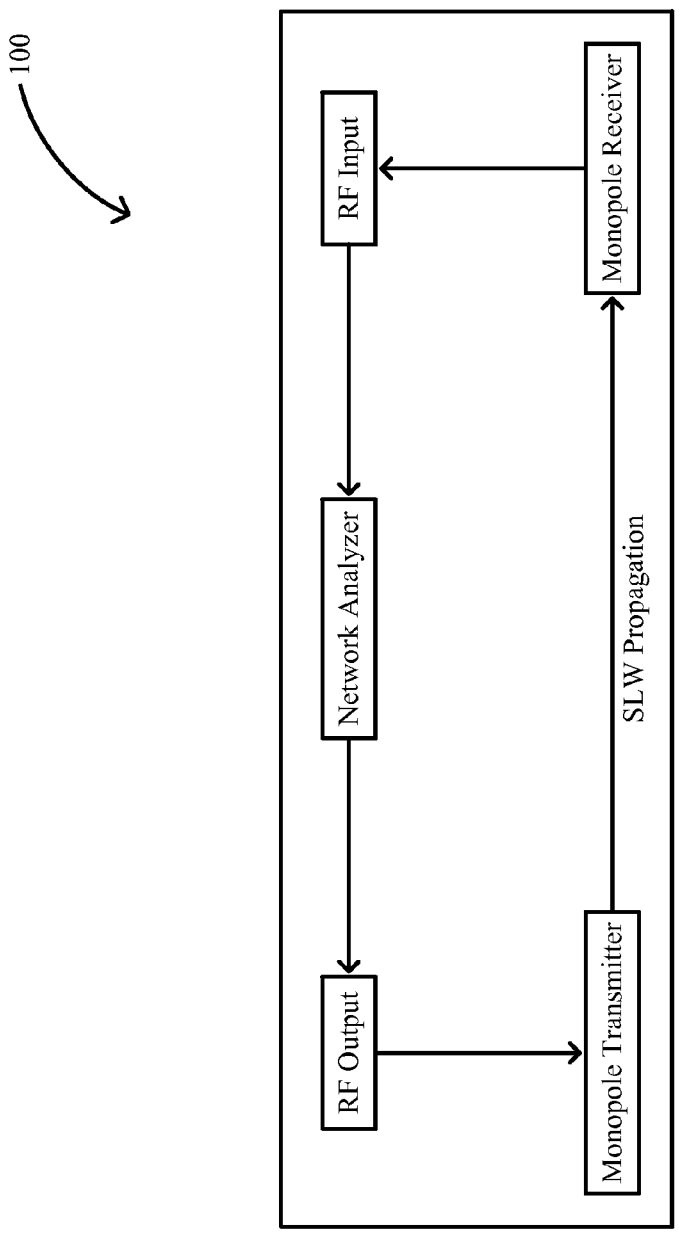
FIG. 1 illustrates a system configured to transmit and/or receive scalar-longitudinal waves, in accordance with one or more implementations.

This disclosure may demonstrate measurement of scalar-longitudinal wave (SLW). The SLW may have $C = \nabla \cdot A + \epsilon \mu \partial \Phi / \partial t$ as a non-zero, dynamical, scalar field, together with a longitudinal E-field. A and $\Phi$ may represent the vector and scalar electrical potentials, respectively. Here, $\epsilon$ and $\mu$ may represent the electrical permittivity and permeability (not necessarily vacuum values), respectively. The SLW may have no magnetic component. Exemplary implementations may provide and/or facilitate transmission and/or reception of the SLW via linear monopole antennas and/or tightly-wound, bifilar, helical coils. Exemplary implementations may facilitate a 1S to 2S atomic transition (mS to nS transition in general). The measurements show that the SLW can be transmitted through a thick Faraday cage or box (thousands of classical skin depths thick) to a companion SLW receiver, either enclosed in a separate Faraday box or without a Faraday box. This result may not be explainable by radiation of classical transverse waves because such waves are eliminated via Faraday cage(s) around the transmitting and/or receiving antennas.

The need for an additional (arbitrary) assumption to solve Maxwell's equations was recognized in the late 1800s. A word equivalent to "arbitrary" was chosen, analogous to the width variation (gauge) of railroad tracks at that time. The gauge function ($\Lambda$) comes from the vector-field solution for the magnetic field, $B=\nabla \times A$. Here, $\Lambda$ may describe the vector potential with infinitely many choices, $A \to A + \nabla \Lambda$, while $B$ is unchanged. The electric field may be represented by $E = -\nabla\Phi - \partial A/\partial t$. Here, $\Phi$ may represent the electric potential with an arbitrariness for the same reason, $\Phi \to \Phi - \partial\Lambda/\partial t$, while $E$ is unchanged. An example may include $\nabla \cdot A + \alpha \in \mu \partial\Phi/\partial t = 0$. The permittivity and permeability may be represented by $\in$ and $\mu$ (not necessarily vacuum), respectively. The Lorenz gauge ($\alpha=1$) may imply that the effect of a charge source propagates at the speed of light, $c$. The Coulomb gauge ($\alpha=0$) may yield electrostatics with $\Phi$ propagation at infinite speed. The velocity gauge ($0<\alpha<1$) may imply $\Phi$ propagation at a speed, $c/\alpha$. The need for a gauge condition may imply that classical electrodynamics is incomplete.

Insight into the incompleteness of classical electrodynamics may begin with the Helmholtz theorem, which states that a sufficiently smooth three-dimensional vector field (F) can be uniquely decomposed into two parts, $F = -\nabla\Phi + \nabla \times A$. A generalized theorem may exist for unique decomposition of a sufficiently smooth, Minkowski four-vector field (three spatial dimensions, plus time) into four-irrotational and four-solenoidal parts, together with the tangential and normal components on the bounding three-surface. With this background, a general electromagnetic Lagrangian density may be written as:

$$\mathcal{L} = -\frac{\varepsilon c^2}{4} F_{\mu\nu} F^{\mu\nu} + J_\mu A^\mu - \frac{\gamma \varepsilon c^2}{2}(\partial_\mu A^\mu)^2 - \frac{\varepsilon c^2 k^2}{2}(A_\mu A^\mu). \quad (1)$$

$F^{\mu\nu}$ may represent the Maxwell field tensor; $E$ may represent the medium's permittivity (not necessarily vacuum); $c$ may represent the speed of light with $c^2 = 1/\in\mu$ (not necessarily vacuum); the four-current may be represented by $J_\mu = (\rho c, J)$; $A_\mu = (\Phi/c, A)$ may represent the four-potential; the Compton wave number for a photon with mass, $m$, may be $k = 2\pi mc/h$; and $h$ may represent Planck's constant. For $\gamma=0$ and $m>0$, EQN. 1 may yield the Maxwell-Proca theory, for which recent tests set an upper bound of $m \leq 10^{-54}$ kg, consistent with massless photons. For $\gamma=1$ and $m=0$, EQN. 1 may be written in terms of the potentials:

$$\mathcal{L}_{EM} = \frac{\varepsilon c^2}{2}\left[\frac{1}{c^2}\left(\nabla\Phi + \frac{\partial A}{\partial t}\right)^2 - (\nabla \times A)^2\right] - \rho\Phi + J \cdot A - \frac{\varepsilon c^2}{2}\left(\frac{1}{c^2}\frac{\partial \Phi}{\partial t} + \nabla \cdot A\right)^2. \quad (2)$$

EQN. 2 may allow two potentially physical classes of four-vector fields. One class may have zero divergence, $C = \partial_\mu A^\mu = 0$, consistent with classical electrodynamics. The second class may have zero curl of $A^\mu$: $F^{\mu\nu} = \partial^\mu A^\nu - \partial^\nu A^\mu = \partial^\mu \partial^\nu \Lambda = 0$ with a solution, $A^\mu = \partial^\mu \Lambda$, and a dynamical quantity, $C = \partial_\mu A^\mu = \partial_\mu \partial^\mu \Lambda$. Here, $\Lambda$ may represent a scalar function of space and time. A more complete electrodynamic model (MCE) may be derived from EQN. 2 with $C \neq 0$:

$$E = -\nabla\Phi - \frac{\partial A}{\partial t}; \quad (3)$$

$$B = \nabla \times A; \quad (4)$$

$$C = \nabla \cdot A + \frac{1}{c^2}\frac{\partial \Phi}{\partial t}; \quad (5)$$

$$\nabla \times B - \frac{1}{c^2}\frac{\partial E}{\partial t} - \nabla C = \mu J; \quad (6)$$

$$\nabla \cdot E + \frac{\partial C}{\partial t} = \frac{\rho}{\varepsilon}. \quad (7)$$

The homogeneous equations ($\nabla \cdot B = 0$; $\nabla \times E + \partial B/\partial t = 0$) may be unchanged from the classical model. EQNS. 3-7 may have the caveat that EQN. 2 is based on the least-action principle, requiring a finite, lower bound on the Lagrangian density. However, EQN. 2 has $(-C^2/2\mu)$, which may imply that an arbitrarily fast change in $\Phi$ over time (or an arbitrarily rapid change in $A$ over space) can make the action arbitrarily large and negative, in violation of the least-action principle. This issue may be resolved by noting that EQNS. 1-7 are based on partial derivatives, i.e., infinitesimal limits over time and space. However, the Planck scale may provide finite limits, where quantum effects of gravity become strong, corresponding to time and length scales of $5.4 \times 10^{-44}$ s and $1.6 \times 10^{-35}$ m, respectively. The Planck scales may be experimentally inaccessible and may be indistinguishable from infinitesimal, thus providing a finite lower bound for EQN. 2. Moreover, EQN. 2 without the new term still has $-(\nabla \times A)^2/2\mu = -B^2/2\mu$, to which a finite lower bound may apply for least action. Classical electrodynamics has been well validated against experiments, so the presence of the new term, $(-C^2/2\mu)$, may not require any modification in the model of EQNS. 1-7.

EQNS. 3-7 may lead to important predictions: (1) relativistic covariance; (2) classical fields ($B$ and $E$) in terms of the usual classical potentials ($A$ and $\Phi$); (3) classical wave equations for $A$, $B$, $E$, and $\Phi$ without use of a gauge condition; and (4) a scalar-longitudinal wave (SLW), composed of the scalar and longitudinal-electric fields. Regarding item (3), the MCE theory may produce cancellation of $\partial C/\partial t$ and $-\nabla C$ in the classical wave equations for $\Phi$ and $A$, thus eliminating the need for a gauge condition (and its attendant incompleteness) in the classical electrodynamics. A necessary and sufficient condition for the SLW may be that $B=0$. The wave equation for a null magnetic field may be shown as $\partial^2 B = \mu \nabla \times J = 0$, which may imply that $J = \nabla \kappa$ as a result of the vector calculus identity, $\nabla \times \nabla \kappa = 0$. Here, $\kappa$ may be a scalar function of space and time. $J$ for the SLW may be gradient driven and thus may be uniquely detectable, in contrast to classical waves that arise from a solenoidal current density ($\nabla \times J \neq 0$). Moreover, the gradient-driven current density may correspond to a longitudinal E-field in linearly conductive media, since $E = J/\sigma = \nabla \kappa/\sigma$.

A wave equation for C may arise by use of $\in\mu(\partial/\partial t)$ on EQN. 7, added to the divergence of EQN. 6:

$$\frac{\partial^2 C}{\partial c^2 t^2} - \nabla^2 C \equiv \Box^2 C = \mu\left(\frac{\partial \rho}{\partial t} + \nabla \cdot J\right). \quad (8)$$

The D'Alembertian may be represented by $^2$; $\in\mu$ may be $1/c^2$ in the propagation medium (not necessarily vacuum). Use of C from EQN. 5 in EQN. 8 may yield an identity via the classical wave equations for $\Phi$ and A, and the vector calculus identity for $\nabla \times \nabla \times A = \nabla(\nabla \cdot A) - \nabla^2 A = 0$ to give $\nabla^2 \nabla \cdot A = \nabla \cdot \nabla^2 A$, since B=0 for the SLW. Charge conservation may give zero on the right-hand side (RHS) of EQN. 8:

$$\Box^2 C = 0. \quad (9)$$

EQN. 9 may provide wave-like solutions, with the lowest-order form in a spherically symmetric geometry at a distance (r), $C = C_o \exp[j(kr - \omega t)]/r$. The boundary condition, $C(r \to \infty) \to 0$, may be trivially satisfied. The scalar field's energy density may be $(C^2/2\mu)$, yielding a constant energy, $4\pi r^2 (C^2/2\mu)$, through a spherical boundary in arbitrary media. Classical electrodynamics may forbid a spherically symmetric, transverse wave. This constraint may be absent under the MCE theory, because the SLW may correspond to a gradient-driven current. The divergence theorem on EQN. 8 may yield interface matching in the normal component ('n') of $\nabla C/\mu$:

$$\left(\frac{\nabla C}{\mu}\right)_{1n} = \left(\frac{\nabla C}{\mu}\right)_{2n}. \quad (10)$$

The subscripts in EQN. 10 may denote $\nabla C$ in medium 1 or medium 2, respectively.

The wave equation for E may come from the curl of Faraday's law, use of $\nabla \times B$ from EQN. 6, and substitution for $\nabla \cdot E$ from EQN. 7 with cancellation of the terms $\nabla(\partial C/\partial t) - (\partial/\partial t)\nabla C$:

$$\frac{\partial^2 E}{\partial c^2 t^2} - \nabla^2 E \equiv \Box^2 E = -\mu \frac{\partial J}{\partial t} - \frac{\nabla \rho}{\varepsilon}. \quad (11)$$

EQN. 11 may represent the classical E-wave form. A time derivative of EQN. 11, and the use of classical charge conservation $(\partial \rho/\partial t = -\nabla \cdot J)$ may yield $^2\ddot{E} = -\mu \ddot{J} + \nabla(\nabla \cdot J)/\in$. Here, the over-dot(s) may indicate partial time derivative(s). B=0 for the SLW may imply $^2 B = \mu \nabla \times J = 0$, allowing use of the vector calculus identity, $\nabla \times \nabla \times J = 0 = \nabla(\nabla \cdot J) - \nabla^2 J$, giving $\nabla(\nabla \cdot J) = \nabla^2 J$, which may imply $^2(\dot{E} + J/\in) = 0$. Linear electrical conductivity $(\sigma)$, $J = \sigma E$, then may give $^2(\dot{E} + \sigma E/\in) = 0$. A very rapidly decaying, transient solution may arise by setting the terms inside the parentheses to zero, giving $E = E_o \exp(-\in t/\sigma)$. Here, $E_o$ may be the initial value of E.

A second solution may use the non-transient form, $E = E_o(r) \exp(-j\omega t)$, which yields:

$$\Box^2 E = 0. \quad (12)$$

The lowest order, outgoing, spherical wave may be, $E = E_o \check{r} \exp[j(kr - \omega t)]/r$, where $\check{r}$ represents the unit vector in the radial direction and r represents the radial distance. As before, the electric wave's energy, $4\pi r^2 (\in E^2/2)$, may be constant through a spherical boundary of arbitrary radius and $E(r \to \infty) = 0$. Substitution of $J = E/\sigma$ into EQN. 12 may yield an equivalent form: $^2 J = 0$. The SLW equations for E and, J may be remarkable for several reasons. First, the vector SLW equations for E and J may be fully captured in one wave-equation for the scalar function $(\kappa)$ $^2\kappa = 0$. This form may be obtained from $^2 J = 0$ by substitution of $J = \nabla \kappa$ into the above identity, $\nabla^2 J = \nabla^2 \nabla \kappa = \nabla(\nabla \cdot J) = \nabla(\nabla^2 \kappa)$. Second, these forms may be like $^2 C = 0$ in EQN. 9. Third, these equations may have zero on the RHS for propagation in conductive media. This last result may arise from B=0 for the SLW, implying no back-electromagnetic field from $\dot{B}$ in Faraday's law that in turn may give no (circulating) eddy currents. Consequently, the SLW may not be subject to the skin effect in media with linear electrical conductivity.

C, E, and J may interact via EQN. 6, which can be rewritten using $J = \sigma E$, and identifying the electrical conductivity with the imaginary part of the complex permittivity $\in \triangleq \sigma/\in_o \omega$:

$$\frac{C}{E_r} = \frac{\varepsilon'}{c}\left(\frac{1 + j\alpha}{1 + j/kr}\right) \quad (13)$$

Spherical waves may be assumed: $E = E_r \check{r} \exp[j(kr - wt)]/r$ and $C = C_0 \exp[j(kr - \omega t)]/r$, $\in_o$ may represent the free space permittivity; f may represent the frequency; $\lambda$, c, and $\in'$, may represent wavelength, speed of light, and real part of the dielectric constant in the propagation medium, respectively; $k = 2\pi/\lambda$, and $\omega = 2\pi f$. EQN. 13 may predict that $|C/E_r| \sim \in'/c$ in a low-conductivity medium $(\alpha \equiv \in/'\in'\ll 1)$, with a phase shift of a between C and $E_r$ in the far field. This ratio may be $|C/E_r| \sim \in/'\in'c$ in a good conductor $(\in/'\in'\gg 1)$ with a phase shift $\sim \pi/2$ in the far field. EQN. 13 may be consistent with the ratio for transverse magnetic and electric fields, $|B|/|E| \sim 1/c$. C may have the same units as the magnetic field. The energy balance equation for the MCE theory may be shown as:

$$\frac{\partial}{\partial t}\left(\frac{B^2}{2\mu} + \frac{C^2}{2\mu} + \frac{\varepsilon E^2}{2}\right) + \nabla \cdot \left(\frac{E \times B}{\mu} + \frac{CE}{\mu}\right) + J \cdot E - \frac{\rho C}{\varepsilon \mu} = 0. \quad (14)$$

Use of the spherical wave forms for E and C in EQN. 14 with B=0 and the ratio of $(C/E_r)$ from EQN. 13 may yield an identity, 0=0; the same result may arise for plane waves, thus explicitly verifying the no-skin-effect prediction. Table 1 shows the unique and testable features of the MCE theory, which predicts transmission and reception of the SLW.

The radiated SLW power $(P_{OUT})$ may be obtained, e.g., as follows. The antenna may be short, linear monopole (length=L) along the z-axis with a gradient-driven current density (J) that is maximal at the feed point (z=0) and zero at the end (z=L). A and $\Phi$ may be obtained from the retarded potentials. E and C may be derived from EQNS. 3 and 5. The radiated power may come from the time-average of the radial component of $CE/\mu$ in EQN. 14.

TABLE 1

Unique and Testable SLW Properties

| Item number and specific SLW property | Equation(s) |
| --- | --- |
| 1) C is a dynamical quantity (scalar field). | EQN. 3-7 |
| 2) C is driven by gradients in J and $\partial E/\partial t$. | EQN. 6 |
| 3) SLW propagates in conductive media without the skin effect. | EQNS. 8-12 |
| 4) Interface matching involves continuity in $(\nabla C/\mu)_n$. | EQN. 10 |
| 5) A longitudinal E-field accompanies C, as an SLW. | EQNS. 11-17 |
| 6) C, E, and J exchange energy in conductive media. | EQNS. 11-17 |
| 7) $|C|/|E| \geq 1/c$ in conductive media, allowing normal instrumentation. | EQN. 13 |

Here, the impedance of the propagation medium may be $Z=(\mu/\in)^{1/2}$, which is 376.73Ω in free space. Terms on the order of $(kr)^{-1}$ and higher may be neglected. The resultant form for $P_{OUT}$ may be shown as:

$$P_{OUT} = \frac{I^2}{4\pi}\sqrt{\frac{\mu}{\varepsilon}}. \quad (15)$$

EQN. 15 may be obtained from the classical, retarded potentials for a gradient-driven current. Then, a paradox arises, since C is a non-zero dynamical field, in contrast to the assumption under which the classical, retarded potentials were obtained via the Lorenz gauge (C=0). The paradox may be resolved by the MCE theory, which predicts explicitly that C is a dynamical field without a gauge assumption.

FIG. 1 illustrates a system 100 configured to transmit and/or receive scalar-longitudinal waves, in accordance with one or more implementations. Some implementations may include an Agilent Technologies E5071C network analyzer (300 kHz-20 GHz). The transmitting and receiving antennas may be identical, because the reciprocity theorem guarantees that the transmitter geometry can also act as a receiver. This simple layout is to facilitate experimental replication in any laboratory with the appropriate facilities and equipment.

Figure 2A:
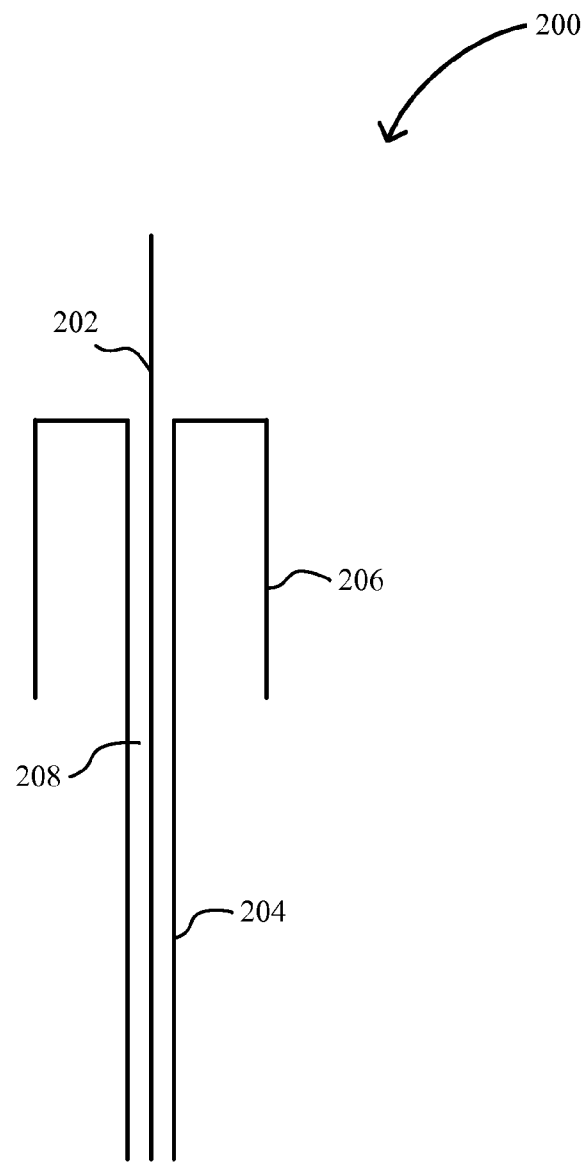
FIG. 2A illustrates a cross-sectional view of a linear monopole antenna apparatus 200 configured to transmit and/or receive scalar-longitudinal waves, in accordance with one or more implementations.

FIG. 2A illustrates a cross-sectional view of a linear monopole antenna apparatus 200 configured to transmit and/or receive scalar-longitudinal waves, in accordance with one or more implementations. The apparatus 200 may include a linear first conductor 202, a tubular second conductor 204, an annular skirt balun 206, and/or other components. The first conductor 202 may extend from a core of a coaxial cable. The second conductor 204 may extend from an outer conductor of a coaxial cable. The first conductor 202 may be configured to operate as a linear monopole antenna at a first operating frequency. The second conductor 204 may be coaxially aligned with the first conductor 202 such that the first conductor 202 extends out in a first direction from within the second conductor 204. The skirt balun 206 may be disposed at an end of the second conductor 204 from which the first conductor 202 extends. The balun 206 may have a larger diameter than the second conductor 204. The balun 206 may extend in a second direction opposite the first direction. The balun 206 may be configured to cancel most or all return current on an outer surface of the second conductor during operation such that the first conductor transmits or receives scalar-longitudinal waves. Some implementations of apparatus 200 may include a tubular dielectric 208 coaxially disposed between the first conductor and the second conductor, the tubular dielectric extending out in the first direction from within the second conductor at least part way up the first conductor.

The configuration of apparatus 200 is for illustrative purposes and should not be viewed as limiting as other configurations are contemplated and are within the scope of the disclosure. In some implementations, the length of the balun 206 extending in the second direction may be approximately one fourth of a wavelength corresponding to the first operating frequency. During operation an electrical current wave on the balun 206 may be approximately 180 degrees out of phase relative to an electrical current wave on the outer surface of the second conductor 204 adjacent to the balun thereby cancelling most or all of the return current on the outer surface of the second conductor.

Attenuation of scalar-longitudinal waves transmitted by the first conductor 202 may be inversely proportional to the square of a distance from a center of the first conductor 202 in free space. Scalar-longitudinal waves transmitted by the first conductor propagate through a conductive medium with substantially lower attenuation relative to a classical skin-depth attenuation. The conductive medium may include a solid-copper Faraday box. Some implementations of apparatus 200 may include a solid-copper Faraday box (not shown) enclosing the first conductor 202, the second conductor 204, and the balun 206. The Faraday box may be configured to block most or all transverse electromagnetic waves impinging the on Faraday box.

Figure 2B:
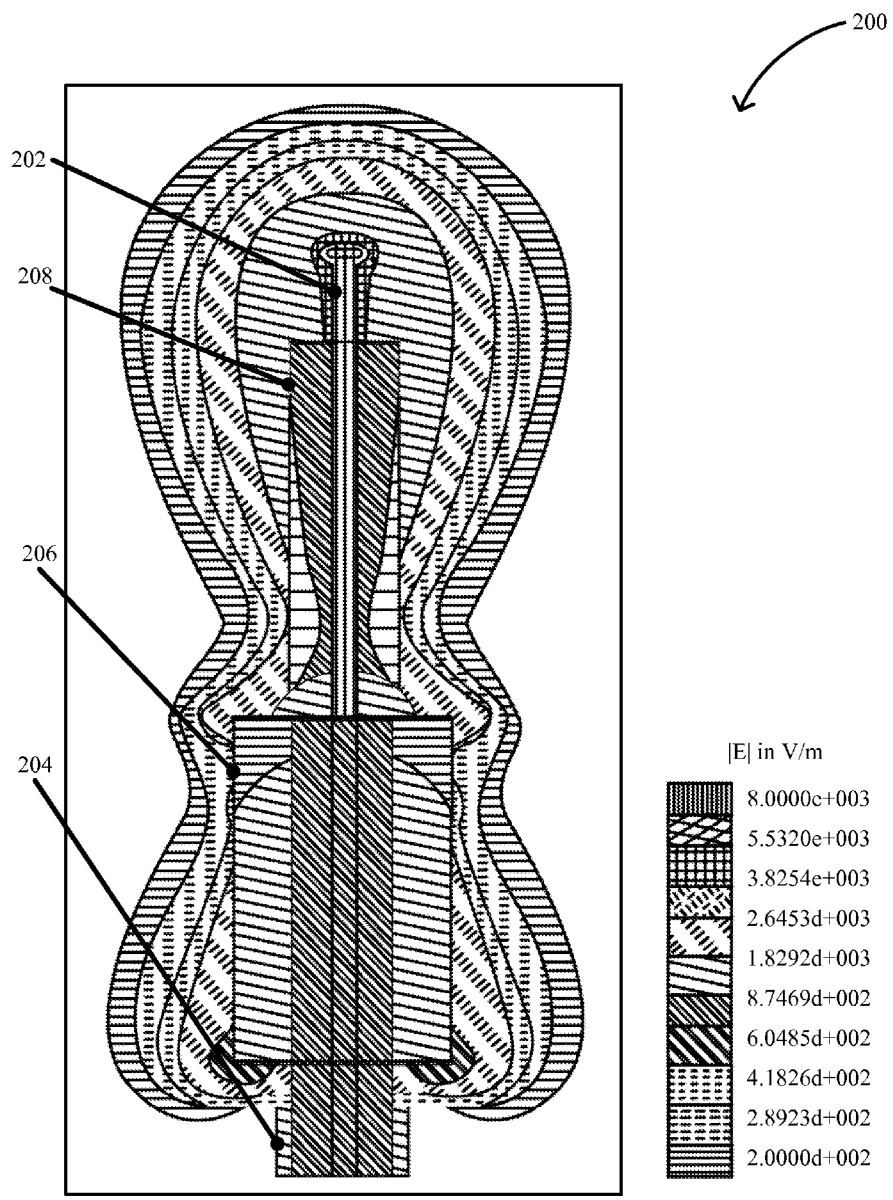
FIG. 2B illustrates a cross-sectional view of constant electric field magnitude contours for a monopole antenna with a skirt balun, in accordance with one or more implementations.

FIG. 2B shows contours of constant |E| for an electrodynamic simulation of a linear monopole antenna apparatus (see, e.g., FIG. 2A). A three-λ-diameter ground-plane disk at the feed-point may give essentially the same |E| contours in the transmitter-to-receiver direction, thus confirming the linear monopolar, counter-poise design of apparatus 200 in FIG. 2A.

High frequency (8 GHz) experiments may allow the use of an indoor, controlled test environment. Electrodynamic simulations predict that the skirt balun 206 in FIG. 2A attenuates the return current on the outside of the coaxial cable (204) by −67.5 db, to make the antenna radiate like a monopole. Grounding to a single point may eliminate current loops. Digital instrumentation may allow accurate measurement of field amplitudes and polarizations. The transmitter-to-receiver distance may be accurately measured to <1 mm. MCE theory may give radical predictions, requiring extraordinary evidence, as shown below.

According to exemplary implementations, an antenna may be a linear, coaxial center conductor with the outer coaxial conductor electrically connected to the top of the skirt balun (see, e.g., FIGS. 2A and 2B). The currents on the coax center conductor and on the outside of the skirt balun may be both in +Z (positive vertical) direction, forming a monopole radiation pattern. The skirt balun length (λ/4) may cause a phase shift in the current flow along the guided path from the bottom (inside surface) of the outer balun conductor (0°) to the top (inside surface) of the skirt balun (90°) and back down the outer surface of the coax outer conductor to the end of the balun (180°). This 180°-phase shift may cause cancellation of the return current flow along the outside of the outer coax conductor. Return-current attenuation may allow the monopole antenna to draw charge from the ground plane (top of the skirt balun) and also may create a close match between the antenna-balun impedance (49.76−j0.24Ω) and the source (50Ω). The measured return loss was −22 db for a single skirt balun (see, e.g., FIGS. 2A and 2B) and −42 db for a double balun (not shown). An exemplary monopole antenna may create an oscillating, gradient-driven current to create the SLW. Second, the skirt balun may dramatically reduce the return current to the source, so that essentially all of the electrical current goes into charging and discharging the antenna. The far-field contours of constant |E| may be mostly spherical on the receiver side (top of the diagram). The RG-405/U coaxial cabling may use a solid, outer conductor to minimize stray fields. The presence or absence of an outer insulating jacket may make no difference in the results of the electrodynamic simulation.

The transmitting antenna may remain in a fixed location, while the receiving antenna may be moved to a transmitter-to-receiver distance (r) in the horizontal plane. The source frequency may be 8 GHz, corresponding to a free-space wavelength, λ=3.75 cm. This choice may allow free space measurements for r over many wavelengths in a well-controlled, laboratory test. The measurements may include: the value of r; and the signal attenuation (dB) between the transmitter and receiver. Repetitions of the test provide an estimate of the statistical error. The measurement results are saved to a database.

Figure 3:
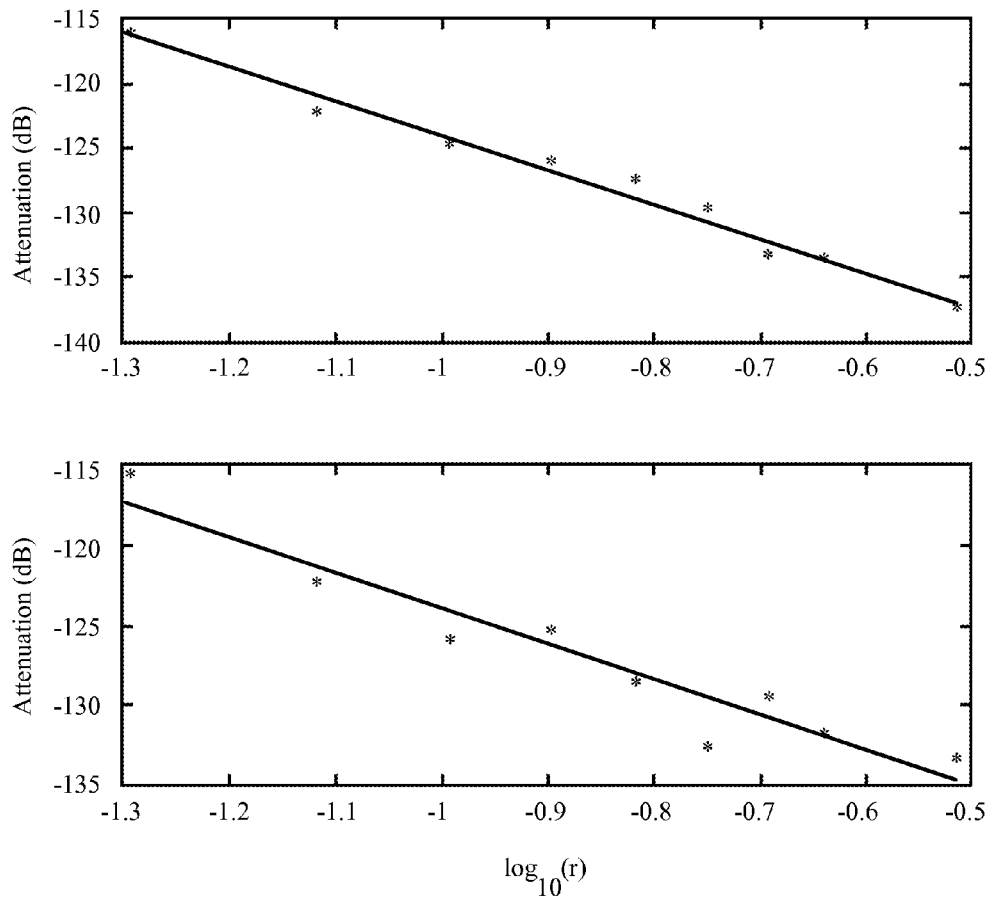
FIGS. 3, 4, 5, and 6 show experimental results for scalar-longitudinal wave attenuation under various conditions.

FIGS. 3, 4, 5, and 6 show experimental results for scalar-longitudinal wave attenuation under various conditions. FIG. 3 shows the attenuation versus separation distance (r) for two, facing, collinear SLW antennas inside an anechoic, Faraday chamber. Both antennas were enclosed by a cylindrical copper pipe with both ends of the copper pipe soldered to hemispherical, copper end caps. The outer conductor of the antenna's coaxial cable was soldered to a hole in one end cap. The attenuation-versus-distance plots show the SLW propagating through both Faraday cages at 8 GHz. The thickness of the two spherical caps corresponds to 2885 skin depths, which should produce a classical attenuation of −25,064 db (down by a factor of $10^{-1253}$). The test measurement yielded an attenuation between −115 db at r=2 cm separation to −137 db at r=30 cm. Extrapolating the straight-line fit to a separation of 2 mm (where the Faraday-caged antennas are barely separated) gives −79 db and −86 db (down by a factor of $10^{-4}$). The difference between the measured values and the classical estimate is −24,985 db, corresponding to >1249 orders of magnitude between attenuation for classical waves and the measured attenuation for the SLW.

Figure 4:
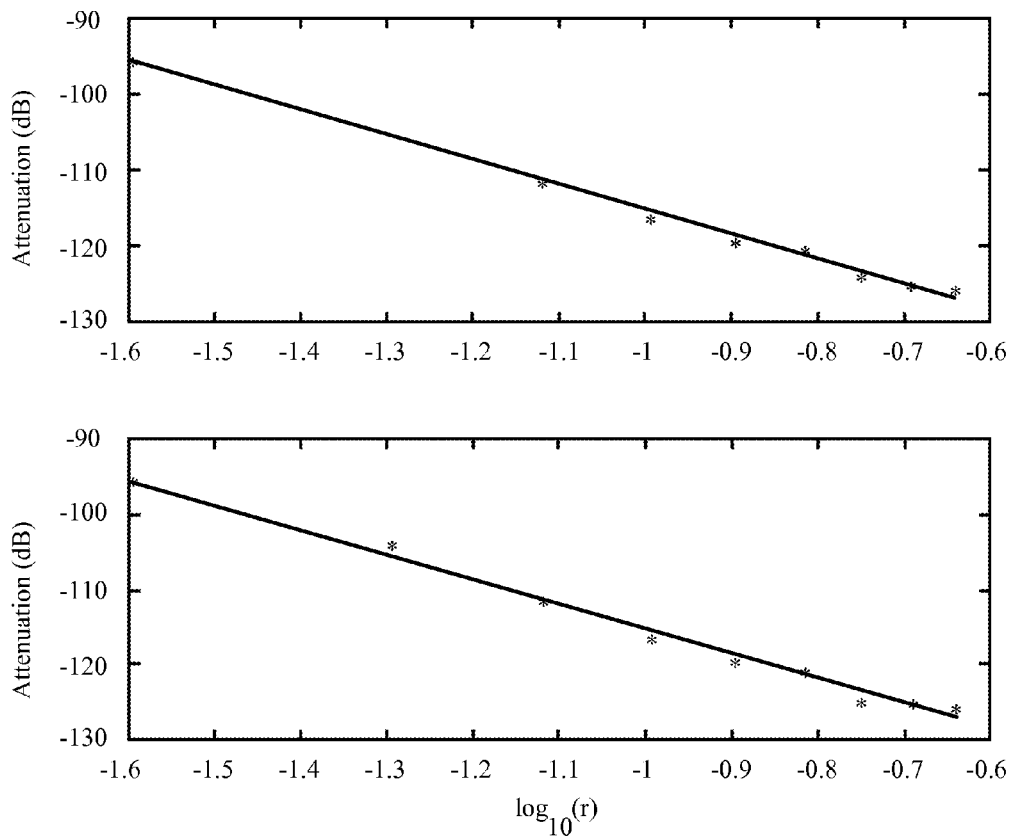

FIG. 4 shows the attenuation versus separation distance (r) for two, facing, collinear SLW antennas. The SLW on port-1 was surrounded by a cylindrical copper pipe with hemispherical end caps as a Faraday cage; the SLW antenna on port-2 had no Faraday cage. Again, the attenuation-versus-distance plots show clear evidence for the SLW propagating through the transmitter's Faraday cage to/from the port-2 SLW antenna at 8 GHz.

Figure 5:
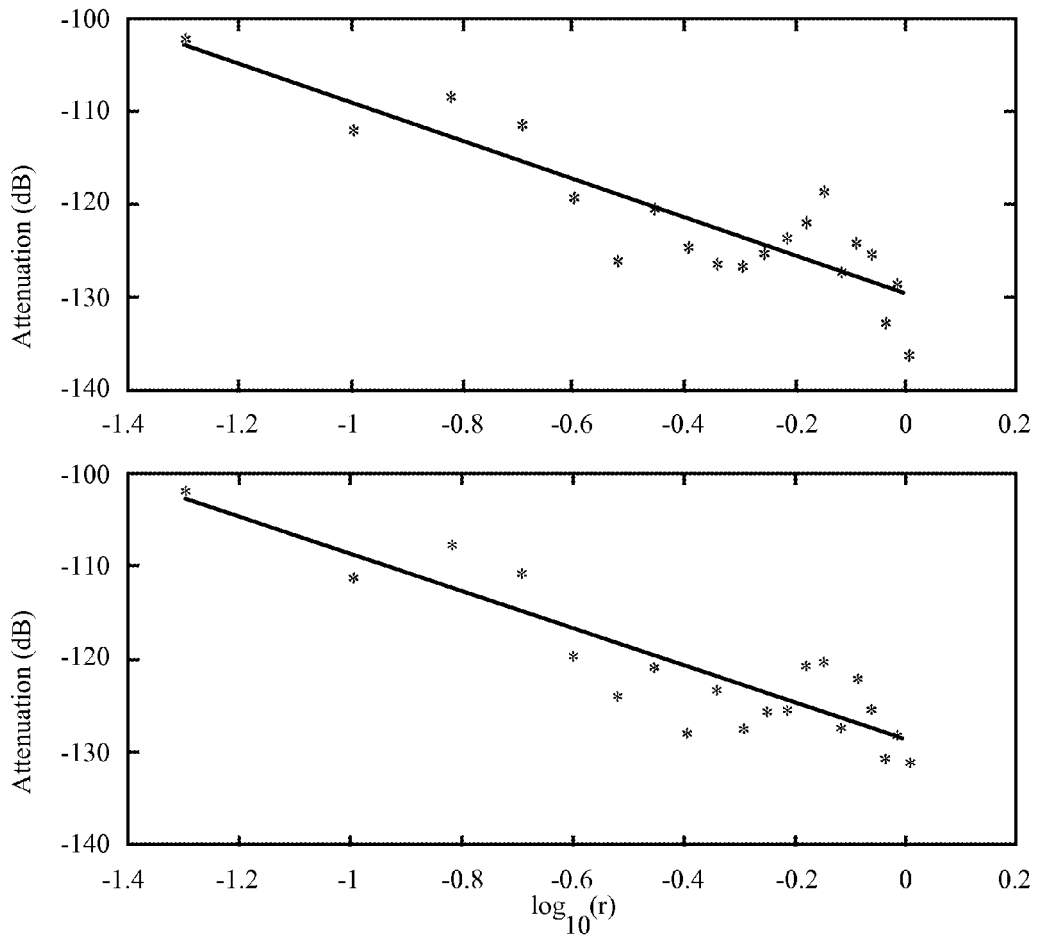

The same attenuation-versus-distance test was performed outside the Faraday-shielded anechoic chamber, on the ground floor of an office building. One SLW antenna had had no Faraday cage; the other SLW had a Faraday cage, as described above. FIG. 5 shows representative results, which varied widely from replicate to replicate, due to irreproducible factors (e.g., image charges and image currents in surrounding conductors, consistent with classical electrodynamics). A key result is propagation of the SLW through the 1442 skin depth of the Faraday box, which attenuates classical transverse waves to an undetectable level.

Figure 6:
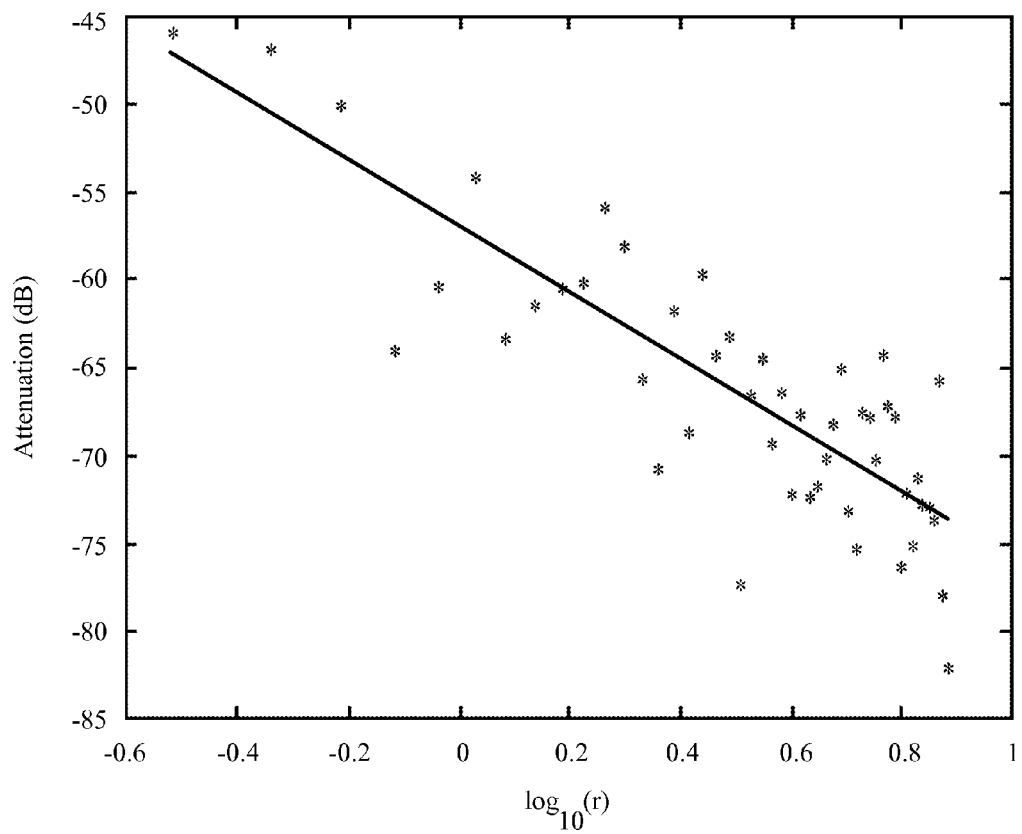

FIG. 6 shows the attenuation versus separation distance (r) for two, vertical SLW antennas at 8 GHz. The SLW antennas were bare (no Faraday cage around either the transmitter or receiver), and both were oriented vertically for comparison with the attenuation measurements for double- and single-Faraday-boxed antennas. This test was performed outside the Faraday-shielded anechoic chamber, on the ground floor of an office building, and consequently displays much variability due to scattering and reflections from nearby conductors. The results in FIGS. 3-5 provide clear evidence for a non-classical wave that is not constrained by the classical skin effect.

Figure 7:
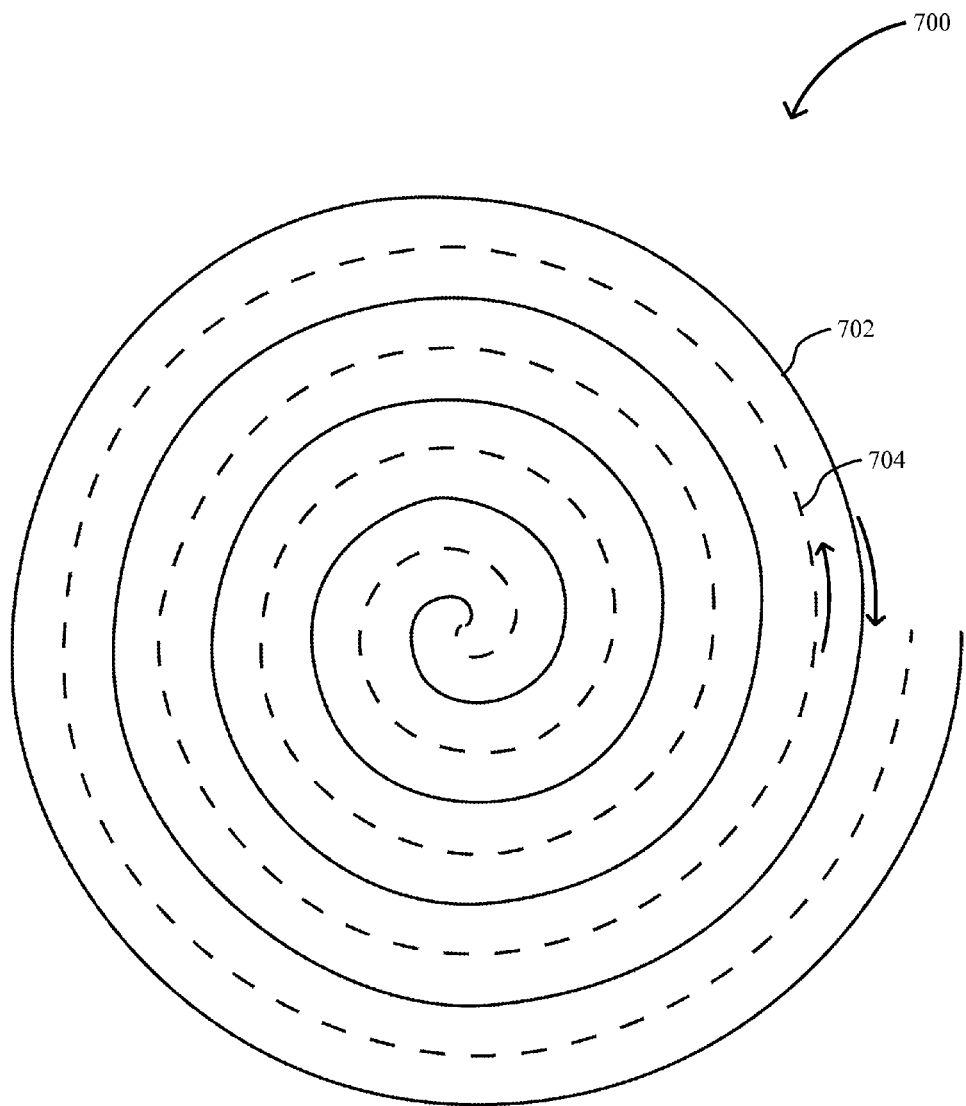
FIG. 7 illustrates a bifilar coil apparatus configured to transmit and/or receive scalar-longitudinal waves, in accordance with one or more implementations.

FIG. 7 illustrates a bifilar coil apparatus 700 configured to transmit and/or receive scalar-longitudinal waves, in accordance with one or more implementations. The apparatus 700 may include a bifilar coil formed in an alternating fashion of a first conductor 702 and a second conductor 704 such that a given turn of the coil that is made of the first conductor 702 is adjacent on either side to turns of the coil made of the second conductor 704. The first conductor 702 and the second conductor 704 may be conductively coupled such that an electrical current in the coil will propagate in opposite directions in adjacent turns of the coil thereby cancelling any magnetic field so that during operation the coil transmits or receives scalar-longitudinal waves. The coil may be configured to create a gradient driven current. There may be zero or approximately zero inductance associated with the coil as a result of magnetic-field cancellation by counter-going electrical currents in adjacent turns of the coil. There may be zero or approximately zero capacitance associated with the coil as a result of adjacent turns of the coil having the same or approximately the same electrical charge density. An electrical resistance of the coil approximately matches a source impedance for maximal transmission of scalar-longitudinal waves.

The configuration of apparatus 700 is for illustrative purposes and should not be viewed as limiting as other configurations are contemplated and are within the scope of the disclosure. In some implementations, the first conductor 702 and the second conductor 704 may be conductively coupled proximate to the center of the coil. In some implementations, the first conductor 702 and the second conductor 704 may be conductivity coupled proximate to an outer edge of the coil. Although shown in FIG. 7 as being spaced apart, in exemplary implementations the first conductor 702 and the second conductor 704 may be tightly wound together to form the coil. In some implementations, the coil may be substantially planar. In some implementations, the coil is formed in a volumetric shape (e.g., a sphere or toroid). The first conductor 702 and the second conductor 704 may include conducting wires, conducting ribbons, and/or other shapes of conducting materials.

Attenuation of scalar-longitudinal waves transmitted by the coil shown in FIG. 7 may be inversely proportional to the square of a distance from the center of the coil in free space. Scalar-longitudinal waves transmitted by the coil may propagate through a conductive medium with substantially lower attenuation relative to a classical skin-depth attenuation. The conductive medium may include a solid-copper Faraday box. In some implementations, apparatus 700 may include a solid copper Faraday box (not shown) enclosing the coil. The Faraday box may be configured to block most or all transverse electromagnetic waves impinging on the Faraday box.

According to some implementations, the coil shown in FIG. 7 may represent (in cross sectional view) of a three-dimensional accumulator of charge, when each conductor is a flat, conductive sheet. The conductive sheet can be wound into a bifilar, helical pancake configuration, like a modern, cylindrical, super-capacitor. However, unlike a super-capacitor, the apparatus 700 of FIG. 7 may allow continuous current flow though the coil windings over a broad range of frequencies. As one normally skilled in the art will appreciate, other geometries are also possible for three-dimensional (volumetric), wire-wound, charge accumulation, such as a sphere and toroid. The apparatus 700 of FIG. 7 may be scaled to higher (or lower) frequencies by limiting the total length of the conductor to $L<<\lambda$, or more specifically $L\leq\lambda/100$. Table 2 shows examples of the conductor lengths (L) versus frequency for free-space propagation.

Note that macro-scale antennas ($L\geq 3$ cm) may occur for frequencies less than or equal to 100 MHz, meaning that a person normally skilled in the art may build such an antenna with the unaided eye. Micro-scale antennas (3 $\mu m \leq L \leq$ cm) may occur for frequencies in the range of 100 MHz to 1 THz, meaning that a person normally skilled in the art may need a microscope to build such an antenna. Nano-scale antennas ($L \leq \mu m$) occur for frequencies of >1 THz, meaning that a person normally skilled in the art may need an electron-microscope (or equivalent) to build such an antenna. High frequencies (>1 THz) may correspond, for example, to atomic transitions from a 1S to a 2S orbital, which are forbidden by classical quantum mechanics on the basis of classical electrodynamics, as discussed above. As one normally skilled in the art can appreciate, analogous molecular, nuclear, and sub-atomic transitions, also exist. Note further that essentially all transverse-wave transmission or reception may be eliminated by enclosing a SLW antenna (e.g., apparatus 200 or apparatus 700) inside a Faraday cage or box (e.g., a copper or aluminum casing not unlike that for a modern super-capacitor).

TABLE 2

Wavelength and L versus frequency

| Frequency ($f$ in Hz) | Wavelength ($\lambda = 3 \times 10^8/f$ in meters) | L ≤ 0.01 $\lambda$ (in meters) |
|---|---|---|
| 1 | $3 \times 10^8$ (300,000 km) | 3,000 km |
| $10^2$ | $3 \times 10^6$ (3,000 km) | 30 km |
| $10^4$ | $3 \times 10^4$ (30 km) | 300 m |
| $10^6$ | $3 \times 10^2$ (300m) | 3 m |
| $10^8$ | $3 \times 1$ (3 m) | 3 cm |
| $10^{10}$ | $3 \times 10^{-2}$ (3 cm) | 0.3 mm |
| $10^{12}$ | $3 \times 10^4$ (0.3 mm) | 3 µm |
| $10^{14}$ | $3 \times 10^{-6}$ (3 µm) | 30 nm |

More complete electrodynamics (MCE) may be important for several reasons. First, the MCE theory may involve a radical revision of Maxwell's equations with one new term ($\partial c/\partial t$) in Gauss' law and one new term ($-\nabla C$) in Ampere's law. These new terms may arise from ($-C^2/2\mu$) in the Stueckelberg Lagrangian. Second, the MCE theory may give relativistic covariance; preservation of the fields (B and E) in terms of the classical potentials (A and $\Phi$); and the classical wave equations for A and $\Phi$ without a gauge condition. Third, the MCE theory may predict new force terms in the MCE momentum balance equation that might explain "dark matter" as a placeholder for unexplained cosmological attractive forces. Fourth, new terms in the MCE energy balance (EQN. 15) may explain "dark energy" as a placeholder for unexplained repulsive cosmological forces. Fifth, the MCE theory (along with classical theory) may predict that a gradient-driven current produces a scalar-longitudinal photon, consisting of both scalar (C) and longitudinal E-field components. This last prediction may make the SLW wave uniquely detectable via a gradient-driven current density in the novel antenna, distinct from classical transverse photons that require a circulating current ($\nabla \times J \neq 0$). The existence of dark matter and dark energy may signify that our physics understanding is incomplete, likely requiring a new idea as profound as general relativity. Scalar-longitudinal waves/photons may be that new idea, as validated by our experimental results.

In some implementations, system 100 (see FIG. 1) may be configured for providing a computational simulator based on scalar-longitudinal waves. The system 100 may include one or more hardware processors (not depicted) configured by machine-readable instructions. The machine-readable instructions may include a simulation component, a classical transverse electromagnetic wave component, a scalar-longitudinal wave component, an evaluation component, an optimization component, and/or other components. The simulation component may be configured to provide a computerized physical simulation environment in which electromagnetic simulations of an antenna or device are performed. In some implementations, the computerized physical simulation environment may include a reflector added to the antenna or device to form a directed beam for transmission and/or reception of scalar-longitudinal waves. The classical transverse electromagnetic wave component may be configured to provide simulated classical transverse electromagnetic waves that are received or transmitted in the electromagnetic simulation of the antenna or device. The scalar-longitudinal wave component may be configured to provide simulated scalar-longitudinal waves that are received or transmitted in the electromagnetic simulations of the antenna or device. The evaluation component may be configured to evaluate characteristics of the antenna or device based on information associated with simulated classical transverse electromagnetic waves and/or simulated scalar-longitudinal waves. The optimization component may be configured to optimize one or more characteristics of the antenna or device based on the evaluation of the characteristics.

A given processor may be configured to provide information processing capabilities in system 100. As such, the given processor may include one or more of a digital processor, an analog processor, a digital circuit designed to process information, an analog circuit designed to process information, a state machine, and/or other mechanisms for electronically processing information. In some implementations, system 100 may include a plurality of processing units. These processing units may be physically located within the same device, or the given processor may represent processing functionality of a plurality of devices operating in coordination. The given processor may be configured to execute machine-readable instructions include the simulation component, the classical transverse electromagnetic wave component, the scalar-longitudinal wave component, the evaluation component, the optimization component, and/or other components of machine-readable instructions. The given processor may execute machine-readable instructions by software; hardware; firmware; some combination of software, hardware, and/or firmware; and/or other mechanisms for configuring processing capabilities on the given processor.

It should be appreciated that the description of the functionality provided by the different machine-readable instruction components described herein is for illustrative purposes, and is not intended to be limiting, as any of the machine-readable instruction components may provide more or less functionality than is described. For example, one or more of the machine-readable instruction components may be eliminated, and some or all of its functionality may be provided by other ones of the machine-readable instruction components. As another example, the given processor may be configured to execute one or more additional machine-readable instruction components that may perform some or all of the functionality attributed herein to one of the machine-readable instruction components.

The system 100 may include electronic storage (not depicted). The electronic storage may store machine-readable instructions and/or other information. Electronic storage may comprise non-transitory storage media that electronically stores information. The electronic storage media of electronic storage may include one or both of system storage that is provided integrally (i.e., substantially non-removable) with a physical computing platform and/or removable storage that is removably connectable to a physical computing platform via, for example, a port (e.g., a USB port, a firewire port, etc.) or a drive (e.g., a disk drive, etc.). Electronic storage may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage may include one or more virtual storage resources (e.g., cloud storage, a virtual private network, and/or other virtual storage resources). Electronic storage may store software algorithms, information determined by processors, and/or other information that enables system 100 to function as described herein.

Figure 8:
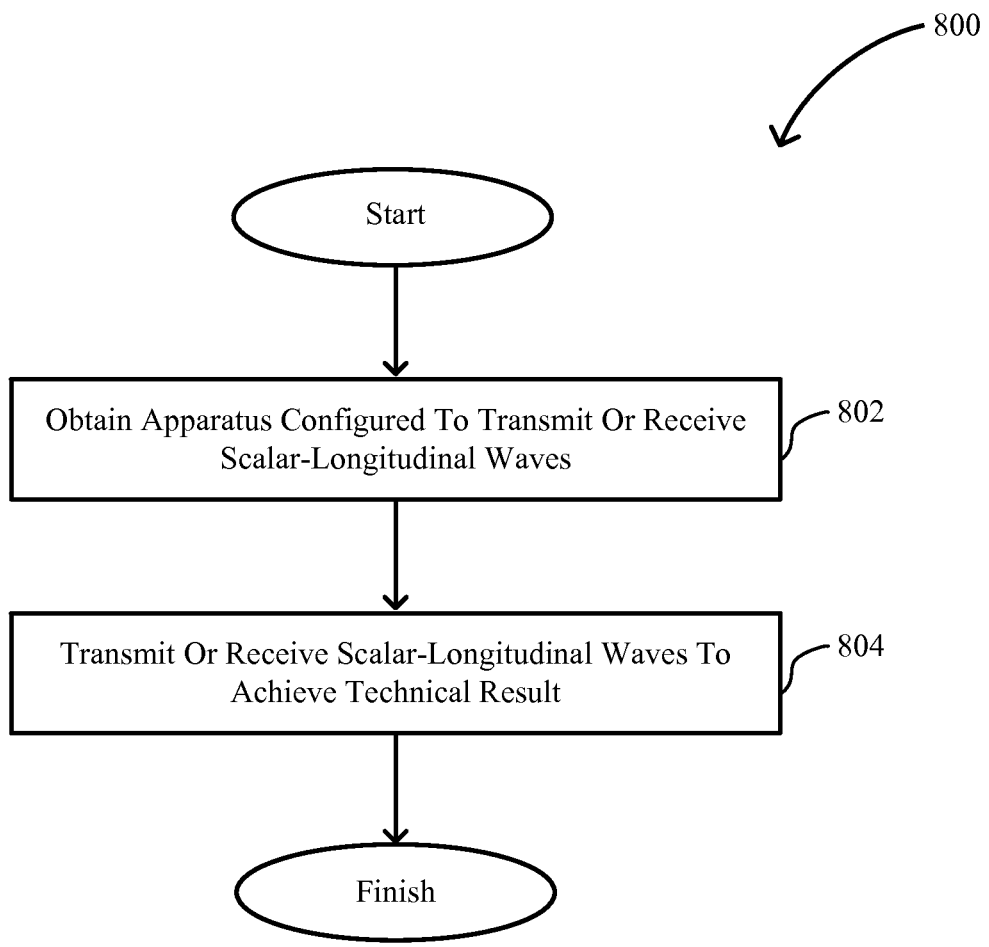
FIG. 8 illustrates a method for utilizing scalar-longitudinal waves, in accordance with one or more implementations.

FIG. 8 illustrates a method 800 for utilizing scalar-longitudinal waves, in accordance with one or more implementations. The operations of method 800 presented below are intended to be illustrative. In some implementations, method 800 may be accomplished with one or more additional operations not described, and/or without one or more of the operations discussed. Additionally, the order in which the operations of method 800 are illustrated in FIG. 8 and described below is not intended to be limiting.

In some implementations, one or more operations of method 800 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 800 in response to instructions stored electronically on an electronic storage medium. The one or more processing devices may include one or more devices configured through hardware, firmware, and/or software to be specifically designed for execution of one or more of the operations of method 800.

At an operation 802, a first apparatus or a second apparatus configured to transmit and/or receive scalar-longitudinal waves may be obtained. The first apparatus (see, e.g., apparatus 200 of FIG. 2A) may include a linear first conductor, a tubular second conductor, and an annular skirt balun. The first conductor may configured to operate as a linear monopole antenna at a first operating frequency. The second conductor may be coaxially aligned with the first conductor such that the first conductor extends out in a first direction from within the second conductor. The balun may disposed at an end of the second conductor from which the first conductor extends. The balun may have a larger diameter than the second conductor. The balun may extend in a second direction opposite the first direction. The balun may be configured to cancel most or all return current on an outer surface of the second conductor during operation such that the first conductor transmits or receives scalar-longitudinal waves. The second apparatus (see, e.g., apparatus 700 of FIG. 7) may include a bifilar coil formed in an alternating fashion of a first conductor and a second conductor such that a given turn of the coil that is made of the first conductor is adjacent on either side to turns of the coil made of the second conductor. The first conductor and the second conductor may be conductively coupled such that an electrical current in the coil will propagate in opposite directions in adjacent turns of the coil thereby cancelling any magnetic field so that during operation the coil transmits or receives scalar-longitudinal waves.

At an operation 804, scalar-longitudinal waves may be transmitted and/or received using the first apparatus or the second apparatus in order to achieve a technical result. Exemplary technical results are described herein but should not be viewed as limiting as other technical results involving scalar-longitudinal waves are contemplated and are within the scope of the disclosure.

In some implementations, the technical result of method 800 may include communicating and/or sensing information underwater.

In some implementations, the technical result of method 800 may include communicating and/or sensing information underground.

In some implementations, the technical result of method 800 may include enhancing (or de-enhancing) a decay rate of a radioactive material. (De)enhancement of radio-active decay rates may be achieved because the Stueckelberg Lagrangian density in EQN. 2 corresponds to new terms (involving C) in the electrodynamic Hamiltonian:

$$\mathcal{H}_{EM} = \left(\frac{\varepsilon E^2}{2} + \frac{B^2}{2\mu}\right) + (\rho - \varepsilon \nabla \cdot E)\Phi - J \cdot A + \frac{C^2}{2\mu} + \frac{C\nabla \cdot A}{\mu}. \quad (16)$$

This MCE Hamiltonian may modify the charged-particle interactions via the SLW (e.g., orbital electrons and nuclear protons in electron-capture decay, and bound electrons and protons in beta decay of neutrons). These new terms may modulate the nuclear barrier potential, causing decay-rate variations in proportion to the SLW power. Indeed, time-variable radioactive-decay rates have been reported (typically ±0.3%) in $^3$H, $^{22}$Na, $^{36}$Cl, $^{44}$Ti, $^{54}$Mn, $^{60}$Co, $^{85}$Kr, $^{90}$Sr, $^{108m}$Ag, $^{133}$Ba, $^{137}$Cs, $^{152}$Eu, $^{154}$Eu, $^{222}$Rn, $^{236}$Ra, and $^{239}$Pu. Typical periods in the decay rate may include: one day, 12.08/year (solar rotation rate), one year, and ~12 years (sun-spot cycle). Classical low-energy nuclear theory is a collection of ad hoc models whose predictions cannot explain these observations. The sun is a sphere of charged particles (plasma) that is well-known to oscillate radially (breathing mode) and in multi-pole modes. The oscillation amplitude of ions is much different from electrons, giving rise to a net radial current density that creates the SLW, which in turn may modulate the radioactive decay rate according to the new terms in EQN. 16. One specific application is use of SLW power to enhance decay of radioactive fission-waste products from a nuclear reactor, and isotopes of proliferation concern.

In some implementations, the technical result of method 800 may include enhancing a fusion rate reaction to produce heat and/or electrical power. Classical methods and apparatus for controlled fusion typically involve maintaining a high enough fuel density (e.g., deuterium and tritium) at a sufficient temperature (e.g., 100 million degrees K) for a long enough time (e.g., many seconds). EQN. 16 predicts modulation of the nuclear barrier potential, allowing fusion reactions at room temperature. Nuclear reactions could be enhanced directly (e.g., $^2D_1 + ^2D_1 + SLW \rightarrow {}_2He^4 + $energy) via cold fusion of $D_2O$ without intermediate steps (and correspondingly complex infrastructure).

Existing electromagnetic/multi-physics simulators use the classical version of Maxwell's equations. A specific application of the MCE theory (EQNS. 1-17) may be a more complete simulator for detailed design of antennas and other electrical/electronic devices that use SLW technology.

A specific application of exemplary implementations may include a focusing SLW antenna. The above tests showed scattering and reflections of the SLW. This observation is consistent with classical electrodynamics, which predicts scattering of electric fields from conductors due to image-charges and image-currents. This observation implies that MCE modifications of electrodynamic simulators may be used for development of SLW antenna(s) for focused transmission (and reception). Such antennas may reduce power, weight, and cost in practical applications.

In some implementations, the technical result of method 800 may include detecting scalar-longitudinal waves emitted from a chemical-bond-breaking process. The chemical-bond-breaking may be caused by seismic activity associated with an earthquake, a failure of a manmade structure, and/or other processes. Earthquake prediction has been sought for decades, and typically may depend on quantitative measurement of underground motion and/or slip-stick stress at tectonic plate boundaries. The seismic activity causes grinding of rock to powder, which may generate high voltages by molecular bond breaking. The voltage corresponds to an electric field, which drives a current gradient, as the SLW driver. These signals occur well in advance of the slip events, and may allow prediction of the time and location of events with suitable SLW detection/imaging. "Earthquake clouds" and electromagnetic precursors of seismic events have been reported. Geophysicists recently discovered low-frequency toroidal oscillations with a period of 2 to 5 minutes; these low-frequency waves may cause excited animal behavior prior to an earthquake. The peeling of tape is another example of bond breaking. The specific applications may include passive detection/prediction of structural failures of all kinds, such as bridges, buildings, critical equipment, and seismic activity.

In some implementations, the technical result of method 800 may include passive imaging of a living organism based on gradient-driven currents across cellular membranes. In some implementations, the technical result of method 800 may include transmission of scalar-longitudinal waves into a living organism to enhance health and/or treat a disease via gradient-driven currents across cellular membranes. Generally speaking, living processes are driven by charged ion transport across the cell membranes. The ion transport is driven, in turn by concentration gradients in the intra- and extra-cellular media. This gradient-driven transport of charged ions creates a gradient-driven electrical current, which is the basis for SLW creation. Consequently, all living organisms create SLWs, which can be imaged by a phased-array of receivers. This new imaging modality may allow passive imaging of living organisms (including people) for research and disease diagnosis and treatment. As one who is normally skilled in the art can appreciate, standard techniques may be used to convert variation in line-of-sight SLW amplitude into an image, not unlike a CT scan. One application is passive imaging of live animals and humans (e.g, brain, heart, lungs). Human electrophysiology has a typical frequency range of 0.5-1000 Hz, implying SLW might be efficacious in this frequency range.

In some implementations, the technical result of method 800 may include imaging an object or a void. The method 800 may include providing a phased-array of scalar-longitudinal waves for the imaging. A phased array of SLW receivers may passively image objects of interest or voids (e.g., underground tunnels, facilities, and pipelines) using the background solar SLW flux for illumination. One specific example is imaging of buildings' interiors, which would be bathed in solar SLW. Detection of underground nuclear tests is part of the nuclear test-ban treaty verification. A nuclear explosion ejects concentric, radially-expanding shells of fast electrons (outer shell) and slower-moving positive-ions (inner shell). These charged shells form a spherical capacitor with a radial E-field (gradient-driven current), thus creating a SLW. The sun is a hot ball of ions and electrons (in the form of a plasma) that oscillates radially, thus creating the SLW that then image solar storms for prediction/mitigation of adverse events (e.g., power outages). More generally, the SLW may be used to create three-dimension images (e.g., via binocular image) that sees through fog, clouds, dust, rain, and building fires during the day or night. Another application is astronomical imaging in the across the entire frequency spectrum.

In some implementations, the technical result of method 800 may include transmission and/or reception of scalar-longitudinal waves for radar imaging of an object and/or a void. The sun emits low-loss SLW, which may be used to form passive images of underwater objects via a phased array that looks upward from the ocean floor. An active, phased-array (or synthetic-aperture) SLW-RADAR from ships, aircraft, and satellites may detect and identify underwater objects, underwater vehicles, underground tunnels, pipelines, underground facilities, stealth aircraft under adverse weather conditions, and/or other objects. The SLW transmission may not need to be limited to one frequency. The SLW transmission may be hyper-spectral (e.g., MHz to THz). A space-based implementation may use satellite arrays to transmit the SLW signal at many frequencies, receive the reflections in synthetic-aperture mode, and process the results on-board for real-time imaging. SLW RADAR can be used for detection of improvised explosive devices (IEDs) on the battlefield.

SLW propagation through conductive media may include ionized plasma around a space vehicle that re-enters the earth's atmosphere. More specifically, SLW-RADAR may be used to characterize space vehicles that re-enter the earth's atmosphere, while surrounded by a hot sheath of plasma. Classical (transverse) electromagnetic waves cannot penetrate the plasma sheath.

In some implementations, the technical result of method 800 may include reception of solar-generated scalar-longitudinal waves to produce electrical power. The MCE theory may predict that a charged sphere, oscillating in a ballooning (monopolar) mode (expanding and contracting radially) will radiate the SLW. The MCE theory may predict that higher-order (multi-pole) oscillations will create the SLW. The sun is a very hot ball of charged particles (electrons and ions in the form of a plasma) that undergoes such oscillations. Consequently, SLW power reaches the earth, just as sunlight does. A specific application may include conversion of solar SLW power into electric power for (re)charging batteries and/or powering electrical device, such as electric vehicles could be replaced by power convertors for the SLW, which is not limited by the skin effect. Harvesting of this solar power may be scalable via advanced photovoltaics that convert the variable-frequency SLW to direct current, then invert the DC power to stable 60 Hz alternating current (for example). An extension of this approach is wireless SLW power transmission that could then be converted to usable electrical power.

A specific application of exemplary implementations may involve electrical power generation from solar SLWs, on the basis of new terms in the MCE momentum balance equation:

$$\varepsilon\mu \frac{\partial}{\partial t}\left(\frac{E \times B}{\mu} - \frac{CE}{\mu}\right) + J \times B + \rho E - CJ + \nabla \times BC = \nabla \cdot \overline{\overline{T}} + \frac{\nabla C^2}{\mu}. \quad (17)$$

$\overline{\overline{T}}$ may represent the Maxwell stress tensor. More specifically, electrical power may be generated by charging a flat-plate capacitor to give a large, directed E-field. SLW emission from the sun may generate force variations across the capacitor plates via the term, $(EC/\mu)$ in EQN. 17, corresponding to a voltage to drive a power-producing current. This power may be proportional to E (and therefore the capacitor voltage) and/or may be proportional to the amplitude of the solar SLW emissions (C). The variable-frequency power may be rectified, and subsequently converted to alternating current via an alternator. More specifically, the sun is an oscillating sphere (monopolar antenna) of charged matter (plasma) that will produce SLW under the MCE theory, because the oscillation distance for ions is different than for electrons for various plasma waves. Earth is a spherical conductor (monopole antenna) that would receive the solar SLW emissions, and would re-radiate them (along with other planets, comets, asteroids). So, near-stellar regions are bathed in SLW emissions, day and night, allowing SLW power-conversion to operate day and night, rain or shine.

The term (EC/µ) in EQN. 17 may be an additional term that forms a generalized Poynting vector, corresponding to the magnitude and direction of power density transmission by the SLW. This new term may imply that SLW power can be transmitted wirelessly over large distances in a directed fashion, for example to power satellites or aircraft from the ground, electrical power transmission, and advanced forms of (directed) beams.

MCE theory may predict new terms in electromagnetic momentum balance and power balance, EQNS. 14 and 17. The term CE/µ may correspond to an increase (or decrease) in longitudinal electrodynamic momentum in EQN. 17 along the direction of motion, with a concomitant decrease (increase) in electrical power per EQN. 14. This sign change may be important because longitudinal electrodynamic power loss (or gain) may drive a corresponding kinetic energy gain (loss) in the physically massive object that is emitting these waves. Consequently, the MCE theory may predict a propulsion mechanism without the use of propellant mass, which is a severe constraint on all transportation systems. This mechanism may depend on adequate energy to create the SLW. The potential applications include all transportation modes on land, sea, air, and space for propellant-less propulsion.

MCE theory may predict a new term, CJ, in EQN. 17. Emission of the SLW from a physically massive object may have at least two components: the longitudinal electric field (E) and the scalar field (C). The electric field may induce an electrical current density (J) in any (distant) conductive object in its path, according to $J=\sigma E$. The concomitant presence of the scalar field (C) may interact with this current to product a force (CJ) on the distant object. By use of a phased array of SLW emitters, the relative of phase of E (and thus J) may be shifted relative to the phase of C. The resultant force, CJ, may be adjusted to have a positive (repulsive) force or a negative (attractive) force, commonly called a "tractor beam." Potential applications may range from the nano- to macro-scales on any conductive object (e.g., sub-atomic particles, molecules, living cells, people, animals, vehicles, comets, asteroids, planets, stars, galaxies).

A mathematical theorem states that nonlinear quantum systems can be used to solve the hardest, non-deterministic, polynomial-time (NP-hard) problems in deterministic polynomial time. The Hamiltonian in EQN. 16 may be inherently nonlinear, and therefore may provide a path to construct such a computer, which would then enable the solution of grand-challenge class problems in a very finite time (minutes to hours, instead of years or more).

High-temperature superconductivity was (HTS) discovered in 1986. The highest critical temperature for HTS is >150K. However, the physical mechanism for HTS is one of the major unsolved problems in theoretical condensed matter physics, in part because the materials are very complex, multi-layered crystals. Moreover, this theoretic effort uses classical electrodynamic interactions in condensed matter, while the MCE theory may provide an explanation on the basis of gradient-driven currents between (or among) the crystal layers. The well-known London model of superconductivity is not gauge invariant. Specifically, the London model works only for the Coulomb gauge, $\nabla \cdot A=0$. Recent experiments show evidence for a Higgs-like mode in two-dimensional superconductors, namely excess absorption of THz radiation. However, the Higgs-like mode may not be an actual particle, but a collective quantum mode. The new Hamiltonian of EQN. 16 may include the SLW due to gradient-driven currents among the crystalline layers, as an explanation of HTS. Many commercial and military applications exist, including sensitive magnetometers based on SQUIDS, fast digit circuits, rapid single-flux quantum technology, maglev trains, MRI imaging, magnetic confinement fusion, magnetics in particle accelerators, microware filters, high sensitivity particle detectors, nanowire single-photon detector, railguns and coilguns, electric motors and generators, fault current limiters, and electrical power storage and transmission.

Recent research has investigated a connection between the SLW, high-temperature superconductors, and gravity. Initial work placed a small, non-conducting, non-magnetic mass (5.48 g) over a levitating, rotating, superconducting disk at <77 K; the mass weighed 0.05-0.3% less, depending on the disk's rotation speed. Subsequent work used a rotating, toroidal, current-carrying, superconducting disk at <70 K; masses placed over the disk weighed 0.3-0.5% less initially and 1.9-2.1% less as the rotation speed was reduced. Further work used a superconducting electrode at 40 K to generate discharges ($10^4$ amps at >1 MV with a trapped magnetic field of ≤1 T). The resultant focused beam propagated without noticeable attenuation through different materials and exerted a short repulsive force on small movable objects in proportion to their mass, independent of the sample's composition. More recent work used a superconducting cathode at 50-70 K and a copper anode to create discharges ($10^4$ amps at ≤2 MV) in low pressure gases. The discharge changed from a spark to a flat glowing plasma that originated from the superconducting cathode at >500 kV. A collimated, non-electromagnetic "radiation pulse" propagated from the cathode, toward and beyond the anode, apparently without attenuation. Recent work used this device to measure the scattering of laser light whose attenuation lasted 34-48 ns and increased with discharge voltage up to 7% at 2 MV. The radiation-pulse propagation speed was measured by two piezoelectric crystals over 1211 m with a time delay of 63±1 ns, corresponding to 64 times the speed of light. Different targets (ballistic pendulums, photons, piezoelectric crystals) are affected differently by the radiation pulse, possibly reacting to beam components at different speeds. This approach may be the basis for a SLW laser.

Spectrum allocation of the SLW may be important for greater data rates over less bandwidth. Examples for higher data rates may be applied to the SLW, such as frequency hopping/re-use, spread-spectrum technology, polarization, code division, and/or other examples. The SLW may be independent of TEM spectrum, effectively doubling the present transmission/reception capacity.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

What is claimed is:

1. An apparatus configured to transmit or receive scalar-longitudinal waves, the apparatus comprising:
   a linear first conductor configured to operate as a linear monopole antenna at a first operating frequency;
   a tubular second conductor coaxially aligned with the first conductor such that the first conductor extends out in a first direction from within the second conductor; and
   an annular skirt balun disposed at an end of the second conductor from which the first conductor extends, the balun having a larger diameter than the second conductor and extending in a second direction opposite the first direction, the balun being configured to cancel most or all return current on an outer surface of the second conductor during operation such that the first conductor transmits or receives scalar-longitudinal waves;
   wherein scalar-longitudinal waves transmitted by the first conductor propagate through a conductive medium with substantially lower attenuation relative to a classical skin-depth attenuation.

2. The apparatus of claim 1, wherein the length of the balun extending in the second direction is approximately one fourth of a wavelength corresponding to the first operating frequency.

3. The apparatus of claim 2, wherein during operation an electrical current wave on the balun is approximately 180 degrees out of phase relative to an electrical current wave on the outer surface of the second conductor adjacent to the balun thereby cancelling most or all of the return current on the outer surface of the second conductor.

4. The apparatus of claim 1, wherein attenuation of scalar-longitudinal waves transmitted by the first conductor is inversely proportional to the square of a distance from a center of the first conductor in free space.

5. The apparatus of claim 1, wherein the conductive medium includes a solid-copper Faraday box.

6. The apparatus of claim 1, further comprising a solid-copper Faraday box enclosing the first conductor, the second conductor, and the balun, the Faraday box being configured to block most or all transverse electromagnetic waves impinging on the Faraday box.

7. The apparatus of claim 1, wherein:
   the first conductor extends from a core of a coaxial cable; and
   the second conductor extends from an outer conductor of the coaxial cable.

8. The apparatus of claim 1, further comprising a tubular dielectric coaxially disposed between the first conductor and the second conductor, the tubular dielectric extending out in the first direction from within the second conductor at least part way up the first conductor.

9. An apparatus configured to transmit or receive scalar-longitudinal waves, the apparatus comprising:
   a bifilar coil formed in an alternating fashion of a first conductor and a second conductor such that a given turn of the coil that is made of the first conductor is adjacent on either side to turns of the coil made of the second conductor, the first conductor and the second conductor being conductively coupled such that an electrical current in the coil will propagate in opposite directions in adjacent turns of the coil thereby cancelling any magnetic field so that during operation the coil transmits or receives scalar-longitudinal waves;
   wherein scalar-longitudinal waves transmitted by the coil propagate through a conductive medium with substantially lower attenuation relative to a classical skin-depth attenuation.

10. The apparatus of claim 9, wherein:
    the first conductor and the second conductor are conductively coupled proximate to the center of the coil; or
    the first conductor and the second conductor are conductivity coupled proximate to an outer edge of the coil.

11. The apparatus of claim 9, wherein the first conductor and the second conductor are tightly wound together to form the coil.

12. The apparatus of claim 9, wherein:
    the coil is substantially planar; or
    the coil is formed in a volumetric shape.

13. The apparatus of claim 9, wherein there is zero or approximately zero inductance associated with the coil as a result of magnetic-field cancellation by counter-going electrical currents in adjacent turns of the coil.

14. The apparatus of claim 9, wherein there is zero or approximately zero capacitance associated with the coil as a result of adjacent turns of the coil having the same or approximately the same electrical charge density.

15. The apparatus of claim 9, wherein the coil is configured to create a gradient driven current.

16. The apparatus of claim 9, wherein an electrical resistance of the coil approximately matches a source impedance for maximal transmission of scalar-longitudinal waves.

17. The apparatus of claim 9, wherein attenuation of scalar-longitudinal waves transmitted by the coil is inversely proportional to the square of a distance from the center of the coil in free space.

18. The apparatus of claim 9, wherein the conductive medium includes a solid-copper Faraday box.

19. The apparatus of claim 9, further comprising a solid copper Faraday box enclosing the coil, the Faraday box being configured to block most or all transverse electromagnetic waves impinging on the Faraday box.

20. A method for utilizing scalar-longitudinal waves, the method comprising:
    transmitting or receiving scalar-longitudinal waves using a first apparatus or a second apparatus in order to achieve a technical result;
    wherein scalar-longitudinal waves transmitted by the first apparatus or the second apparatus propagate through a conductive medium with substantially lower attenuation relative to a classical skin-depth attenuation;
    wherein the first apparatus comprises:
       a linear first conductor configured to operate as a linear monopole antenna at a first operating frequency;
       a tubular second conductor coaxially aligned with the first conductor such that the first conductor extends out in a first direction from within the second conductor; and
       an annular skirt balun disposed at an end of the second conductor from which the first conductor extends, the balun having a larger diameter than the second conductor and extending in a second direction opposite the first direction, the balun being configured to cancel most or all return current on an outer surface of the second conductor during operation such that the first conductor transmits or receives scalar-longitudinal waves; and
    wherein the second apparatus comprises:
       a bifilar coil formed in an alternating fashion of a first conductor and a second conductor such that a given turn of the coil that is made of the first conductor is adjacent on either side to turns of the coil made of the second conductor, the first conductor and the second conductor being conductively coupled such that an electrical current in the coil will propagate in opposite directions in adjacent turns of the coil thereby cancelling any magnetic field so that during operation the coil transmits or receives scalar-longitudinal waves.

21. The method of claim 20, wherein:
the technical result includes communicating and/or sensing information underwater; or
the technical result includes communicating and/or sensing information underground.

22. The method of claim 20, wherein:
the technical result includes enhancing a decay rate of a radioactive material; or
the technical result includes enhancing a fusion rate reaction to produce heat and/or electrical power.

23. The method of claim 20, wherein the technical result includes detecting scalar-longitudinal waves emitted from a chemical-bond-breaking process, the chemical-bond-breaking being caused by seismic activity associated with an earthquake or a failure of a manmade structure.

24. The method of claim 20, wherein the technical result includes imaging an object or a void.

25. The method of claim 24, further comprising providing a phased-array of scalar-longitudinal waves for the imaging.

26. The method of claim 20, wherein:
the technical result includes passive imaging of a living organism based on gradient-driven currents across cellular membranes; or
the technical result includes transmission of scalar-longitudinal waves into a living organism to enhance health and/or treat a disease via gradient-driven currents across cellular membranes.

27. The method of claim 20, wherein the technical result includes transmission and/or reception of scalar-longitudinal waves for radar imaging of an object and/or a void.

28. The method of claim 20, wherein the technical result includes reception of solar-generated scalar-longitudinal waves to produce electrical power.

* * * * *